(12) United States Patent
Louis

(10) Patent No.: US 7,825,023 B2
(45) Date of Patent: Nov. 2, 2010

(54) METHOD OF MANUFACTURING AN INTERCONNECTION STRUCTURE

(75) Inventor: Didier Louis, Coublevie (FR)

(73) Assignee: Commissariat a L'Energie Atomique, Paris (FR)

( * ) Notice: Subject to any disclaimer, the term of this patent is extended or adjusted under 35 U.S.C. 154(b) by 762 days.

(21) Appl. No.: 11/702,697

(22) Filed: Feb. 5, 2007

(65) Prior Publication Data

US 2007/0275261 A1  Nov. 29, 2007

(30) Foreign Application Priority Data

Feb. 8, 2006  (FR)  .................................. 06 50443

(51) Int. Cl.
*H01L 29/40*  (2006.01)
*H01L 21/4763*  (2006.01)

(52) U.S. Cl. ...................... 438/622; 438/623; 438/624; 438/625; 438/626

(58) Field of Classification Search .......... 438/622–626
See application file for complete search history.

(56) References Cited

U.S. PATENT DOCUMENTS 5,078,802 A * 1/1992 Imanaka et al. ............. 435/264
5,750,415 A   5/1998 Gnade et al. ................ 437/195
2002/0047207 A1* 4/2002 Sekiguchi ................... 257/758
2004/0137728 A1   7/2004 Gallagher et al. ........... 438/689
2006/0014374 A1   1/2006 Barth et al. ................. 438/622
2006/0040492 A1* 2/2006 Goodner et al. ............. 438/638

FOREIGN PATENT DOCUMENTS

| FR | 2641896 A1 | 7/1896 |
| GB | 2239659 A | 7/1991 |
| WO | 2004/001842 | 12/2003 |

OTHER PUBLICATIONS

French Preliminary Examination Seach Report, FA 674554 and FR 0650443, 3 pgs, (Nov. 10, 2006).

* cited by examiner

*Primary Examiner*—Matthew C Landau
*Assistant Examiner*—James M Mitchell
(74) *Attorney, Agent, or Firm*—Nixon Peabody LLP

(57) ABSTRACT

This invention relates to a process for manufacturing interconnection structures, including:
  a) the formation on a substrate of a first layer comprising one or several conducting zones (24) and one or several insulating zones made of an organic material (26),
  b) coverage of this first layer by a porous layer (28),
  c) consumption and elimination of at least part of the organic material through the porous layer, using enzymes and/or proteins.

19 Claims, 3 Drawing Sheets

METHOD OF MANUFACTURING AN INTERCONNECTION STRUCTURE

CROSS REFERENCE TO RELATED APPLICATION OR PRIORITY CLAIM

This application claims priority of the French Patent Application No. 06 50443 filed Feb. 8, 2006.

FIELD OF THE INVENTION

The invention relates to the domain of integrated circuits and manufacturing of interconnection structures, making use of conducting elements such as copper or aluminum, these conducting elements being separate from dielectric zones.

BACKGROUND OF THE INVENTION

Improvement of the performances of integrated circuits requires an improvement to the integrated materials present. Although manufacture of the transistor (hot part of the integration) has continued to maximize the use of basic materials such as doped polycrystalline silicon and a silicon oxide grid dielectric for the last 30 years, a technological break has occurred in the choice of materials for the interconnection part. Copper has replaced aluminum for reasons of resistivity and therefore propagation of the electronic signal. Similarly, for reasons of parasite capacitance between the metallic interconnection strips, the dielectric material that for a long time was based on plasma deposited silicon oxide, has been replaced by materials with lower dielectric constant, frequently called <<Low-k>> materials (where k is the dielectric constant).

Copper is still the single choice for the conducting material for circuits far on the input side. But the dielectric material is changing, because the important parameter is to reduce its dielectric constant to reduce phenomena related to parasite capacitances created between the conducting strips.

Therefore, we have changed from a silicon oxide type material deposited by PECVD plasma techniques to materials still based on silicon, but that have a different nature more and more similar to organic structures (introduction of carbon in the monomer structure-structures —(Si—OC)——)).

Apart from the development of increasingly organic structures, introduction of porosities appears as being one of the solutions to reduce the dielectric constant of these insulating materials, the ultimate purpose being to integrate air with a dielectric constant equal to 1.

Such structures are already known in prior art; for example refer to document WO 2004/001842. This document discloses the use of an organic material that is then eliminated by thermal degradation by various physicochemical processes (plasma attack or wet chemical etching.

Different approaches are possible to make these cavities between lines, such as the use of a sacrificial material during integration that is then extracted using various physicochemical processes (plasma type attack, or wet chemical etching).

A first possibility is to use a dielectric material deposited between interconnection strips and then eliminated by thermal degradation, that may or may not be assisted by ultraviolet or electron radiation.

A second possibility consists of making a nonconforming deposit that does not entirely fill the cavity during the deposition step, thus creating an air volume.

The difficulty of known approaches is to find a sacrificial material capable of resisting integration stresses (thermal budget, mechanical stress, etc.).

Another limitation to these techniques relates to the globality of the process; the entire sacrificial material is eliminated regardless of the technique used.

In order to satisfy this problem, cavities may be defined by lithography and etching, which in this precise case addresses specific and required zones (for example creation of an air gap in dense zones only). One problem (and not the least) is that adding these steps is very expensive industrially.

Finally, and regardless of what technique is used, the creation of a good "air gap" should preferably satisfy the following criteria:
  no residues left in the air gap (leakage current between lines, breakdown field between lines).
  no etching of the copper and barrier layers surrounding the entire copper line, to avoid electromigration and electro corrosion phenomena.

PRESENTATION OF THE INVENTION

The invention proposes a new process for manufacturing such structures, in which the following is formed on a substrate:
  a first layer including one or several conducting zones and one or several insulating zones made of an organic material, for example a polysaccharide or protein material,
  this first layer is covered by a porous layer,
  enzymes and/or proteins are used to consume at least part of the organic material through the porous layer and to eliminate it.

Therefore, the sacrificial organic material is covered with a porous membrane through which enzymes can pass that thus digest this same organic material.

According to the invention, cavities and porous structures are created at the ultimate stage in the development of the dielectric constant, using a sacrificial material no longer eliminated by integration methods like that defined in prior art, but rather by using digestion or enzyme biodegradation.

Therefore the enzyme or protein consumes a compound, for example such as a polymer, to make it biodegradable.

The enzyme has the advantage of being very selective concerning digestion of materials.

The sacrificial organic material is covered by a porous membrane during integration, for example of the purely organic type, through which enzymes can pass and thus "digest" the organic material. Enzymes are proteins and act in small quantities, in the same way as any chemical catalyst.

An insulating layer can be made on the porous layer, after at least part of the organic material has been eliminated, with a step to form pads or metallic strips or lines in this insulating layer.

Such a process may also include manufacturing of a second layer comprising one or several conducting zones and one or several insulating zones made of an organic material, and this second layer can be covered by a second porous layer. At least part of the organic material in the second layer may be consumed and eliminated through the second porous layer, using enzymes and/or proteins.

One of the advantages of a process according to the invention is that the material can be deposited at ambient temperature, while remaining compatible with the constraints of microelectronic integration.

Another advantage of the process according to the invention is that the enzymatic reaction may engage in an aqueous or non-aqueous medium.

The process according to the invention has other advantages:
  the end of the enzymatic digestion reaction can be managed for example by using ultra-violet radiation or thermal heating,
  carbon based residues of the enzymatic reaction are not killers for the devices, the chemical enzymatic digestion reaction only concerns the sacrificial material, and does not have any impact on other surrounding materials. Therefore there is no risk of separation, attack between the different layers in the stack, changes to the dimensions, or attack on the conducting material (copper).

Preferably, the enzymatic digestion takes place at temperatures of about 20° C., for example between 15 and 50° C.

The invention also relates to a connection structure comprising:
a first layer itself including one or several conducting zones, one or several insulating zones made of an organic material, and one or several cavities,
a first porous layer covering the first layer.

A connection structure according to the invention may also comprise an insulating layer on the porous layer.

Pads or strips or metallic lines may also be made in the insulating layer.

Such a structure may also include a second layer itself including one or several conducting zones, and one or several insulating zones made of an organic material, the second layer possibly also including one or several cavities.

The invention also relates to a connection structure including:
a first layer itself including one or several conducting zones, and cavities separating these conducting zones,
a first porous layer and a first dielectric layer covering the first layer.

DETAILED PRESENTATION OF PARTICULAR EMBODIMENTS

Figure 1:
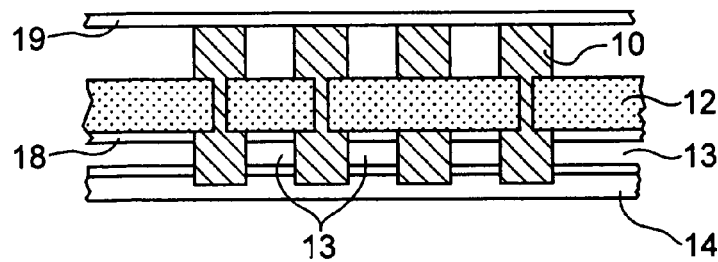
FIG. 1 shows a device obtained by a process according to the invention.

FIG. 1 shows a device obtained using a process according to the invention; conducting elements 10, for example made of copper, pass through a dielectric membrane 12, thus connecting this membrane and a substrate 14. A layer comprising an alternation of cavities 13 separating the conducting elements 10 is arranged between the dielectric membrane 12 and the substrate 14. The references 18 and 19 denote porous layers as described below. As a variant, the layer 19 could be eliminated.

FIGS. 2A-2G show the steps in a process according to the invention.

Figure 2A:
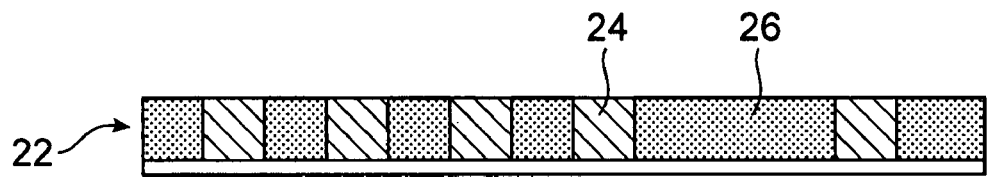
FIGS. 2A-2G show steps in a process according to the invention.

In a first step, a first layer 22 is made including one or several conducting zones 24 and one or several insulating zones 26 made of an organic sacrificial material (FIG. 2A).

The organic sacrificial material may be deposited by a spin coater between the pads or the metal strips 24. For example it may be a polysaccharide (sugar) or a protein. A polysaccharide type of material could be dissolved in an appropriate solvent so as to control its viscosity to spread it with the spin coater.

The chemical composition of the sacrificial material may be of the same type as starch:

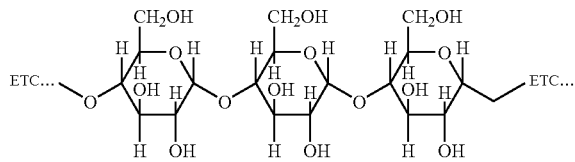

Derivatives of cellulose and glycogen may also be used, or any polysaccharides in general.

Figure 2B:
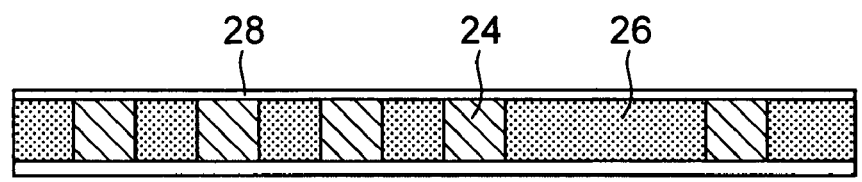

A porous membrane 28 is then formed on this first layer 22, for example with a spin coater or using the CVD technique (FIG. 2B). This membrane may be a purely organic type (for example a derivative of Ethylene phthalate), with pore sizes compatible with microelectronic integration (for example between 2 nm and 10 nm).

Figure 2C:
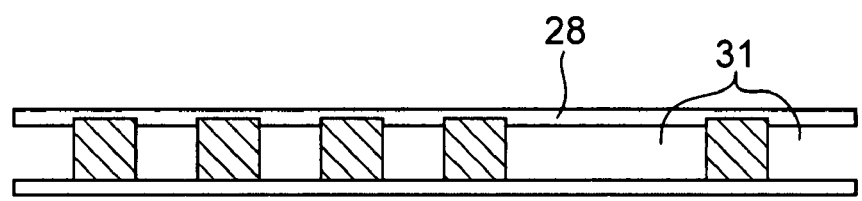

Enzymes or proteins can then digest the organic material 26 through the porous layer 28 (FIG. 2C). Plates may be dipped or put into a bath, for example an aqueous bath containing enzymes or proteins. The bath may be stagnant or supplied continuously to accelerate the reaction. The duration of the reaction depends on the quantity of material to be digested, the temperature (the reaction is faster if the temperature is increased), for example it may be between a few hours and one day. An enzymatic hydrolysis reaction consumes the organic material, leaving the cavities 31 free under the porous membrane 28. In the example shown in FIG. 2C, all of the organic material is consumed, leaving only cavities separating the conducting zones 24. Partial consumption of the organic material of this layer is also possible, as described below.

The enzymatic catalysis may be broken down into 3 steps:
formation of an Enzyme—Substrate complex (biodegradable compound) between the enzyme and its substrate,
transfer of protons and electrons bringing up transition compounds,
release of reaction products.

Proteins that are molecules for which the three-dimensional structure determines the biological function, are fragile and their structure may be altered and their function cancelled out or transformed if the temperature of the reaction medium in which they are located is too high. This property can be useful to terminate enzymatic digestion, by heating.

Figure 2D:
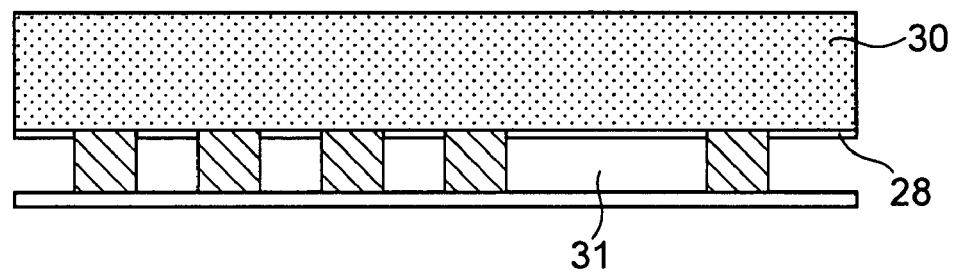
Figure 2E:
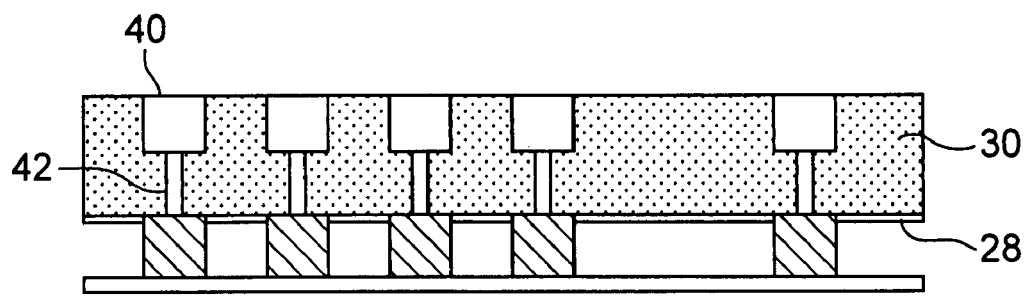
Figure 2F:
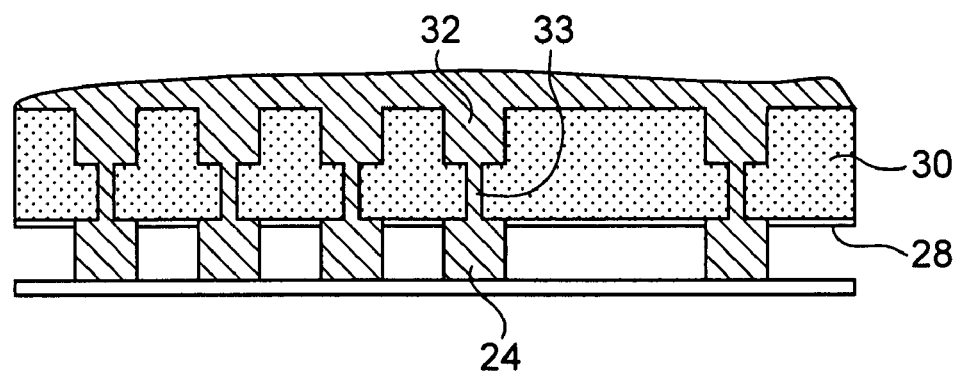

A layer 30 can be produced on the porous layer 28 after this digestion, for example made of a dielectric material such as $SiO_2$ (FIG. 2D).

This layer may itself be etched (FIG. 2E) so as to define a second level of lines 40 and an intermediate hole level 42, or vias.

Figure 2G:
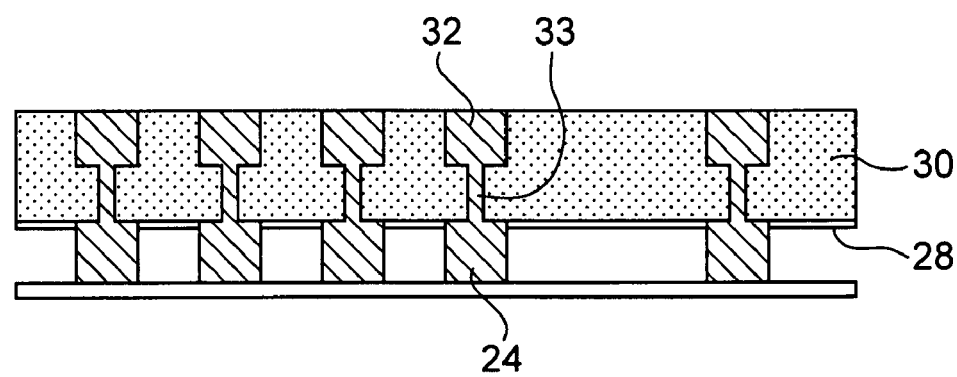

A deposit of a conducting material 32 (FIG. 2F) can fill in these etched zones to create the required conducting levels 33, 35. A polishing step may be carried out on this deposit (FIG. 2G).

Figure 3:
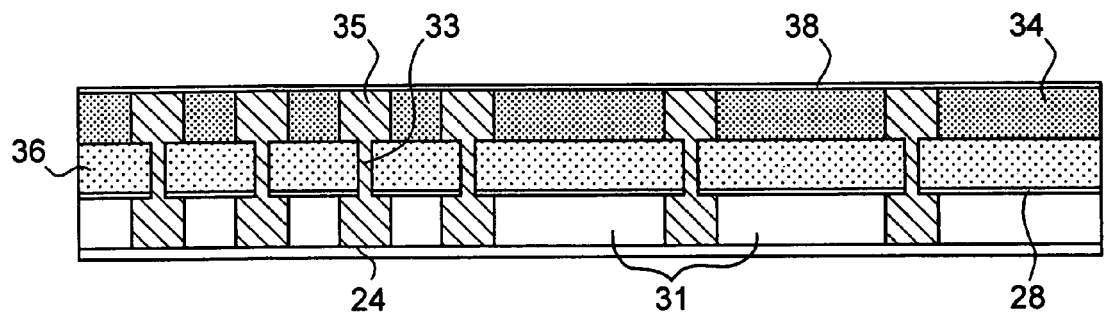
FIGS. 3, 4 and 5 show variant embodiments of devices according to the invention.

According to one variant shown in FIG. 3, a second level 34 of organic material is made on an intermediate level 36 of dielectric material, of the $SiO_2$ or SiOC type. This second organic sacrificial layer 34 may have a composition chosen from among the compositions described above for the layer 26. This layer 34 and the dielectric layer 36 are etched. A metallic deposit is used to form conducting pads 35 in this layer that may be connected to pads or to strips 24 through lines 33 made in the layer 36.

The next step is deposition of a new porous membrane 38, for example of the same nature as the first membrane 28 or with a composition chosen from among those mentioned above.

Enzymes or proteins may then digest all or some of the organic material 34 through the porous layer 38. Therefore a second enzymatic hydrolysis reaction at least partially consumes the organic material 34. For example, reaction conditions may be deduced from reaction conditions already given above.

This process may be repeated on an arbitrary number of stages, a dielectric layer of a stage deposited on the porous membrane used to attack the organic material in the previous stage.

The result obtained is then a damascene type integrated structure comprising a layer of permanent material between copper pads that may be connected through conducting lines.

It is also possible to have a staggered structure for which some stages are not digested or etched by one of the processes described above, at least one of the organic layers of one of the other stages being at least partially eliminated by one of these processes according to the invention.

Figure 4:
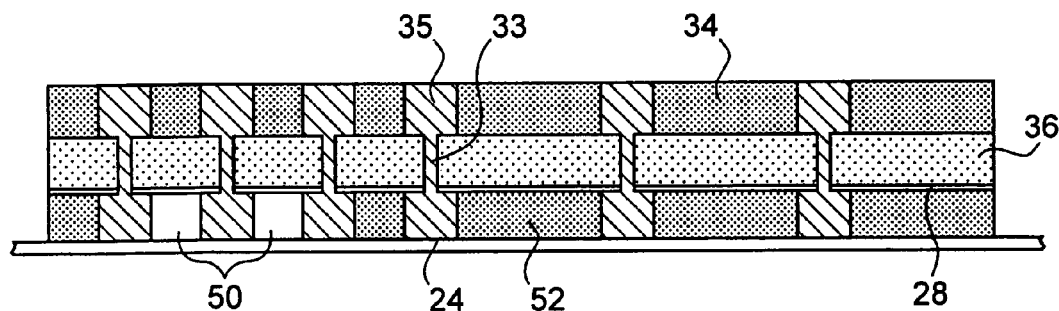

According to yet another variant shown in FIG. 4, one organic material level, for example the first level, is only consumed locally, for example by the use of a mask. Thus, local air zones can be formed in a level also containing an organic or mineral type material 52. A second level 34 of organic material may once again be made on an intermediate level 36 of dielectric material, of the $SiO_2$ or SiOC type, this second level possibly having a composition chosen from among those already indicated above for layer 26. This layer 34 and the dielectric layer 36 are etched. A metallic deposit is used to form conducting pads 35 that can be connected to pads or strips 24 through lines 33 made in the layer 36. The layer 34 may then be totally or partially digested, like the first layer 26 (FIG. 2A) or 52 (FIG. 4).

This other variant can allow the material to subsist in one or several organic levels (in FIG. 4 in the first level 52), that reinforces the mechanical strength of the assembly.

Figure 5:
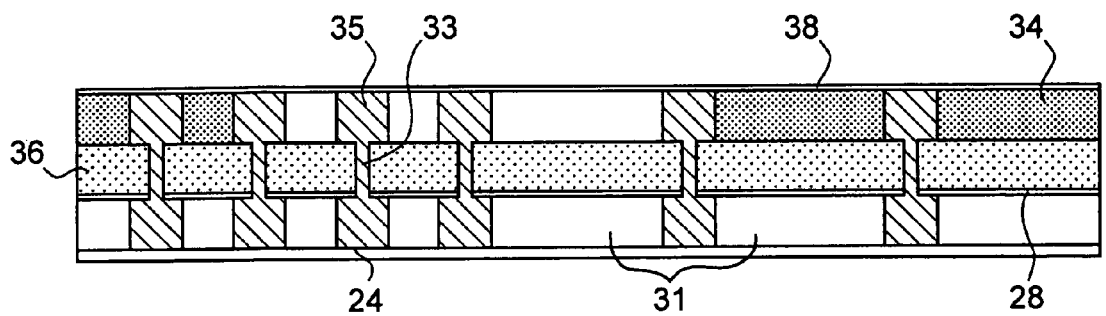

FIG. 5 shows a structure according to the invention comprising a first layer in which all of the organic material has been consumed, only leaving cavities 31 separating the conducting pads 24, and an upper organic layer 34 that has been partially consumed by enzymatic digestion through a membrane 38. If no additional stage is added, the layer 38 may be eliminated. Enzymatic digestion could even take place without the layer 38, and digestion is then direct. The same comment is applicable for the structures in FIGS. 2A and 2B. However, in the context of complete integration in which integration is terminated by a level of pads, this layer 28 can assure mechanical support of the global structure.

What is claimed is:

1. Process for manufacturing interconnection structures, comprising:
   a) the formation, on a substrate, of a first layer comprising one or more conducting zones and one or more insulating zones made of an organic material,
   b) coverage of the first layer by a porous layer,
   c) consumption and elimination of all of the organic material in at least one of the one or more insulating zones, through the porous layer, using enzymes and/or proteins.

2. Process set forth in claim 1, the porous layer being of the purely organic type.

3. Process set forth in claim 1, the porous layer being a derivative of Ethylene phthalate.

4. Process set forth in claim 1, in which ultra-violet radiation is directed towards the substrate, or the substrate is heated, so as to terminate the organic material consumption reaction.

5. Process set forth in claim 1, the organic material being deposited by spin coating between the conducting zones.

6. Process set forth in claim 1, the organic material being a polysaccharide or a protein.

7. Process set forth in claim 1, further comprising:
   manufacturing an insulating layer on the porous layer after the eliminating of the organic material; and
   forming pads or strips or metallic lines in the insulating layer.

8. Process set forth in claim 7, also comprising manufacturing of a second layer including one or several conducting zones and one or several insulating zones made of an organic material, and covering of this second layer by a second porous layer.

9. Process set forth in claim 8, also comprising consumption and elimination of at least part of the organic material in the second layer, through the second porous layer, using enzymes and/or proteins.

10. Process for manufacturing interconnection structures, comprising:
    forming a first layer on a substrate, the first layer comprising one or more conducting zones and one or more insulating zones made of an organic material;
    covering the first layer with a porous layer;
    applying an enzyme and/or protein through the porous layer to eliminate at least part of the organic material via a reaction; and
    directing an ultra-violet radiation towards the substrate or heat the substrate, thereby terminating the elimination of at least part of the organic material the one or more insulating zones.

11. Process set forth in claim 10, wherein the porous layer being of the purely organic type.

12. Process set forth in claim 10, wherein the porous layer is a derivative of Ethylene phthalate.

13. Process set forth in claim 10, wherein the organic material is deposited by spin coating between the conducting zones.

14. Process set forth in claim 10, wherein the organic material is a polysaccharide or a protein.

15. Process set forth in claim 10, further comprising:
    manufacturing an insulating layer on the porous layer after the eliminating at least part of the organic material; and
    forming pads or strips or metallic lines in the insulating layer.

16. Process set forth in claim 15, further comprising manufacturing of a second layer including one or several conducting zones and one or several insulating zones made of an organic material, and covering of this second layer by a second porous layer.

17. Process set forth in claim 16, further comprising consumption and elimination of at least part of the organic material in the second layer, through the second porous layer, using enzymes and/or proteins.

18. Process for manufacturing interconnection structures, comprising:
    forming, on a substrate, a first layer comprising one or more conducting zones and one or more insulating zones made of an organic material,
    consuming and eliminating all of the organic material in the at least one of the one or more insulating zones using enzymes and/or proteins.

19. Process for manufacturing interconnection structures, comprising:
    forming a first layer on a substrate, the first layer comprising one or more conducting zones and one or more insulating zones made of an organic material;
    applying an enzyme and/or protein to eliminate at least part of the organic material via a reaction; and
    directing an ultra-violet radiation towards the substrate or heat the substrate, thereby terminating the elimination of at least part of the organic material the one or more insulating zones.

* * * * *